(12) United States Patent
Yasukawa

(10) Patent No.: US 7,898,149 B2
(45) Date of Patent: Mar. 1, 2011

(54) POWER SUPPLY DEVICE AND IMAGE FORMING APPARATUS

(75) Inventor: Kouji Yasukawa, Mishima (JP)

(73) Assignee: Canon Kabushiki Kaisha, Tokyo (JP)

( * ) Notice: Subject to any disclaimer, the term of this patent is extended or adjusted under 35 U.S.C. 154(b) by 575 days.

(21) Appl. No.: 11/953,847

(22) Filed: Dec. 10, 2007

(65) Prior Publication Data

US 2008/0260402 A1    Oct. 23, 2008

(30) Foreign Application Priority Data

Dec. 13, 2006  (JP) .............................. 2006-336379
Nov. 20, 2007  (JP) .............................. 2007-300973

(51) Int. Cl.
    *H01L 41/107* (2006.01)
(52) U.S. Cl. ..................................... 310/318
(58) Field of Classification Search .................. 310/318
    See application file for complete search history.

(56) References Cited

U.S. PATENT DOCUMENTS 6,853,153 B2 *  2/2005  Gray .......................... 315/291
7,135,807 B2 * 11/2006  Min et al. .................... 310/317
7,265,479 B2    9/2007  Yamaguchi et al.
2001/0050513 A1* 12/2001 Takeda et al. ........... 310/316.01
2002/0085395 A1*  7/2002 Navas Sabater et al. ....... 363/25
2005/0016283 A1*  1/2005 Micko .......................... 73/649
2006/0222398 A1  10/2006 Nagasaki et al.
2006/0273688 A1  12/2006 Yasukawa et al.
2006/0285367 A1* 12/2006 Yasumura ................. 363/21.03
2007/0007855 A1*  1/2007 Murata et al. ................ 310/317

FOREIGN PATENT DOCUMENTS

JP          11-206113 A       7/1999

* cited by examiner

*Primary Examiner* — Thomas M Dougherty
(74) *Attorney, Agent, or Firm* — Fitzpatrick, Cella, Harper & Scinto

(57) ABSTRACT

A power supply device is disclosed that outputs a voltage of a wider range with a single piezoelectric transformer. The power supply device includes a piezoelectric transformer 101 for applying an output voltage to a transfer member that transfers a toner image formed on an image bearing member onto a recording material. The power supply device further includes a generation unit 110 configured to generate a driving frequency for driving the piezoelectric transformer 101. A control unit 701 controls a spurious voltage by changing driving frequency characteristics of the power supply device in accordance with a target value of an output voltage Vout.

13 Claims, 10 Drawing Sheets

POWER SUPPLY DEVICE AND IMAGE FORMING APPARATUS

BACKGROUND OF THE INVENTION

1. Field of the Invention

The present invention relates to a power supply device for an image forming apparatus that uses an electrophotographic process, and an image forming apparatus.

2. Description of the Related Art

A power supply device is already known that applies an output voltage to a transfer member that transfers a toner image formed on an image bearing member onto a recording material. For example, in an image forming apparatus according to an electrophotographic method in which a transfer roller comprising roller-shaped conductive rubber wound around a metal shaft is used as a transfer member, the transfer member is rotationally driven in conformity with the process speed of a photosensitive member. A direct current bias voltage is used as the voltage applied to the transfer member, and in order to perform favorable transfer using the transfer roller, normally a current of about 10 µA is applied.

To generate the high voltage required for image formation as described above, conventionally a wire-wound type electromagnetic transformer has been used. However, the electromagnetic transformer comprises a copper wire, a bobbin, and a magnetic core, and when used in an image forming apparatus of the above kind of specifications, since the output current value is a minute current of about 10 µA, it has been necessary to reduce leakage current at each part to a minimum. It has thus been necessary to insulate the winding of the transformer with a mould or the like, and since a large transformer has been required relative to the power supply, this has proved a hindrance to miniaturization and lightening of high voltage power supply devices (power supply devices for outputting a high voltage).

Therefore, to compensate for these shortcomings, a unit that generates a high voltage using a high-output piezoelectric transformer that is thin and lightweight is being studied (Japanese Patent Laid-Open No. 11-206113). That is, by using a piezoelectric transformer that is made from a ceramic material, it is possible to generate a high voltage with efficiency that is greater than that of an electromagnetic transformer. Furthermore, since it is also possible to provide a distance between electrodes on a primary side and a secondary side, it is not necessary to perform a special mold process for insulation, and the excellent characteristics gained from a high-voltage generator being made small and lightweight can be obtained.

The characteristics of a piezoelectric transformer are generally that an output voltage forms a shape with a wide base that reaches a maximum at a resonance frequency f0 as shown in FIG. 9, and control of the output voltage by frequency is possible. When controlling the output voltage at a driving frequency that is higher than the resonance frequency f0, the driving frequency is changed from a high frequency to a low frequency to increase the output voltage of the piezoelectric transformer. Conversely, when controlling the output voltage at a driving frequency that is lower than the resonance frequency f0, the driving frequency is changed from a low frequency to a high frequency to increase the output voltage.

In a circuit using the piezoelectric transformer as described in Patent Document 1, the operating frequency range of a voltage controlled oscillator (VCO) is set to a range that includes the resonance frequency f0. More specifically, control is performed in a voltage range including a voltage larger than the voltage of an unwanted resonance frequency (resonance frequency other than f0; hereunder referred to as "spurious frequency") that is generated due to the structural characteristics of the piezoelectric transformer and smaller than a voltage at the resonance frequency f0. It is known that inputting a voltage that does not include harmonic contents such as a sine wave into the piezoelectric transformer is effective for suppressing occurrence of this spurious frequency.

However, according to the aforementioned prior art, the piezoelectric transformer has a configuration that is liable to be affected by a spurious frequency because the voltage waveform includes harmonic contents as shown in FIG. 8. In a case in which it is necessary that the required voltage range is wide (for example, when using a transfer roller with large load fluctuations caused by the environment), control has been difficult at the low voltages at which the transformer is liable to be affected by a spurious frequency. There is also a problem that a method that drives a piezoelectric transformer with a sine wave in order to suppress the occurrence of a spurious frequency involves high costs.

SUMMARY OF THE INVENTION

The present invention enables output of a wider range of voltages with a single piezoelectric transformer.

According to one aspect of the present invention, there is provided a power supply device that outputs a voltage using a piezoelectric transformer, comprising a frequency generation unit configured to generate a driving frequency for driving the piezoelectric transformer, a control unit configured to control an output voltage of the piezoelectric transformer by controlling a driving frequency of the frequency generation unit, and a driving voltage switching unit configured to switch a driving voltage that is supplied to the piezoelectric transformer, wherein, the control unit instructs the driving voltage switching unit to switch the driving voltage in accordance with a setting value of the output voltage.

Further features of the present invention will become apparent from the following description of exemplary embodiments with reference to the attached drawings.

DESCRIPTION OF THE EMBODIMENTS

Preferred embodiments of the present invention will now be described in detail with reference to the drawings. It should be noted that the relative arrangement of the components, the numerical expressions and numerical values set forth in these embodiments do not limit the scope of the present invention unless it is specifically stated otherwise.

(Piezoelectric Transformer High-Voltage Power Supply Background Technology)

Figure 8:
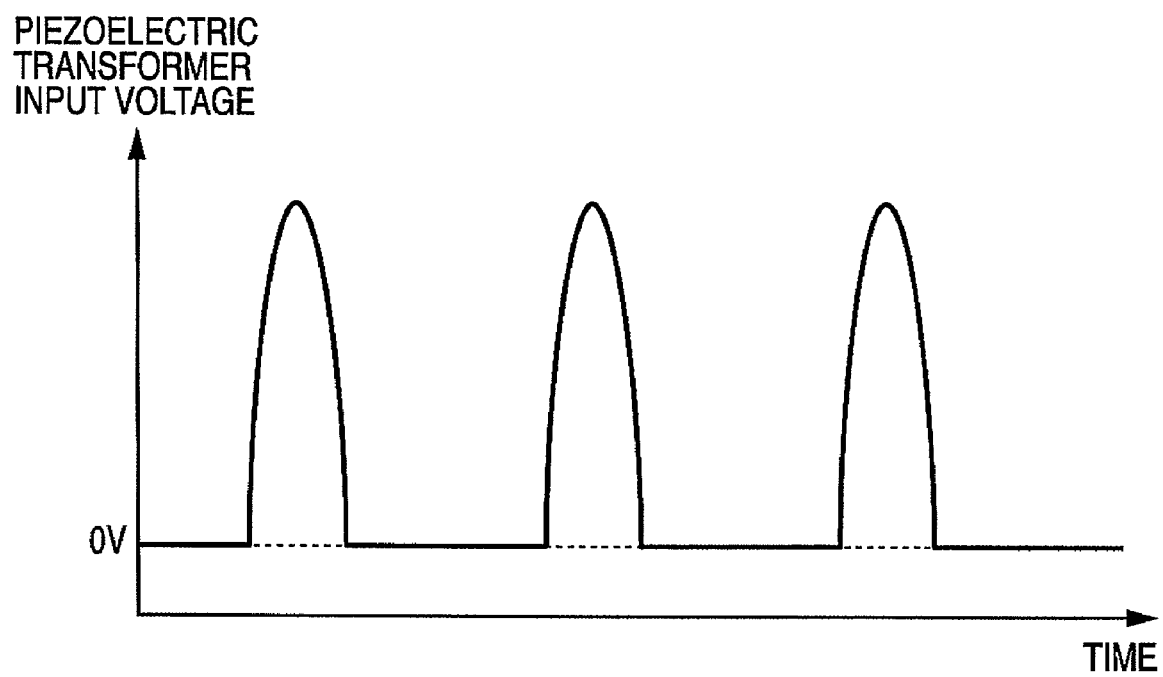
FIG. 8 is a view that represents an input voltage waveform of a piezoelectric transformer.
Figure 10:
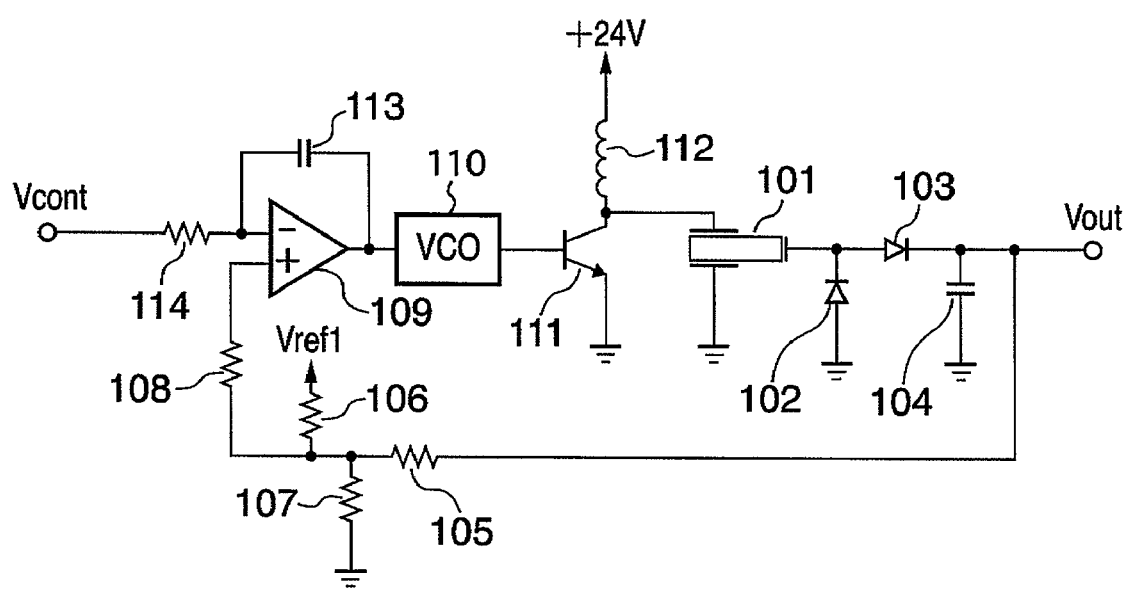
FIG. 10 is a view that illustrates the operation of a high voltage power supply circuit according to the background technology.

First, background technology for the piezoelectric transformer high-voltage power supply according to the present invention will be described using FIG. 10. The circuit shown here is a high voltage power supply in which reference numeral 101 denotes a piezoelectric transformer (piezoelectric ceramic transformer) of a high voltage power supply. The output of the piezoelectric transformer 101 is rectified and smoothed into a positive voltage by diodes 102 and 103 and a high voltage capacitor 104, and supplied to a transfer roller (not shown) that is the load. The output voltage is divided by resistances 105, 106, and 107, and input to a noninverting input terminal (+ terminal) of an operational amplifier 109 through a protective resistance 108. Meanwhile, a control signal (Vcont) of the high voltage power supply that is an analog signal of a DC controller 201 is input via a resistance 114 to an inverting input terminal (− terminal) of the operational amplifier. By configuring the operational amplifier 109, the resistance 114, and a capacitor 113 as shown in FIG. 10, the circuit functions as an integration circuit. The control signal Vcont that is smoothed with the integration time constant that is determined according to the number of components of the capacitor and the resistance is then input to the operational amplifier 109. The output end of the operational amplifier 109 is connected to a voltage controlled oscillator (VCO) 110 as a generation unit. The VCO 110 switches a transistor 111 with a frequency that is in accordance with the output voltage of the operational amplifier 109, and the voltage is amplified with an inductor 112 such that a voltage as shown in FIG. 8 is supplied to the primary side of the piezoelectric transformer 101.

In FIG. 10, a drive circuit of the piezoelectric transformer forms an LC resonance flyback converter using the transistor 111, the inductor 112, and the piezoelectric transformer input capacitance (not illustrated). This configuration is low cost and a high input voltage effective value can be obtained.

First Embodiment

Next, a first embodiment of the present invention will be described. The present embodiment is a color laser printer comprising a piezoelectric transformer power source that stably outputs a voltage of a wider range than the circuit illustrated for the background technology with a single piezoelectric transformer. More specifically, since control can be carried out at a low voltage without receiving the influence of a spurious frequency even in a case in which it is necessary that the required voltage range is wide (for example, a case using a transfer roller with large load fluctuations caused by the environment), the present embodiment switches between a high output voltage and a low output voltage according to the conditions.

<Configuration of Overall Apparatus>

Figure 2:
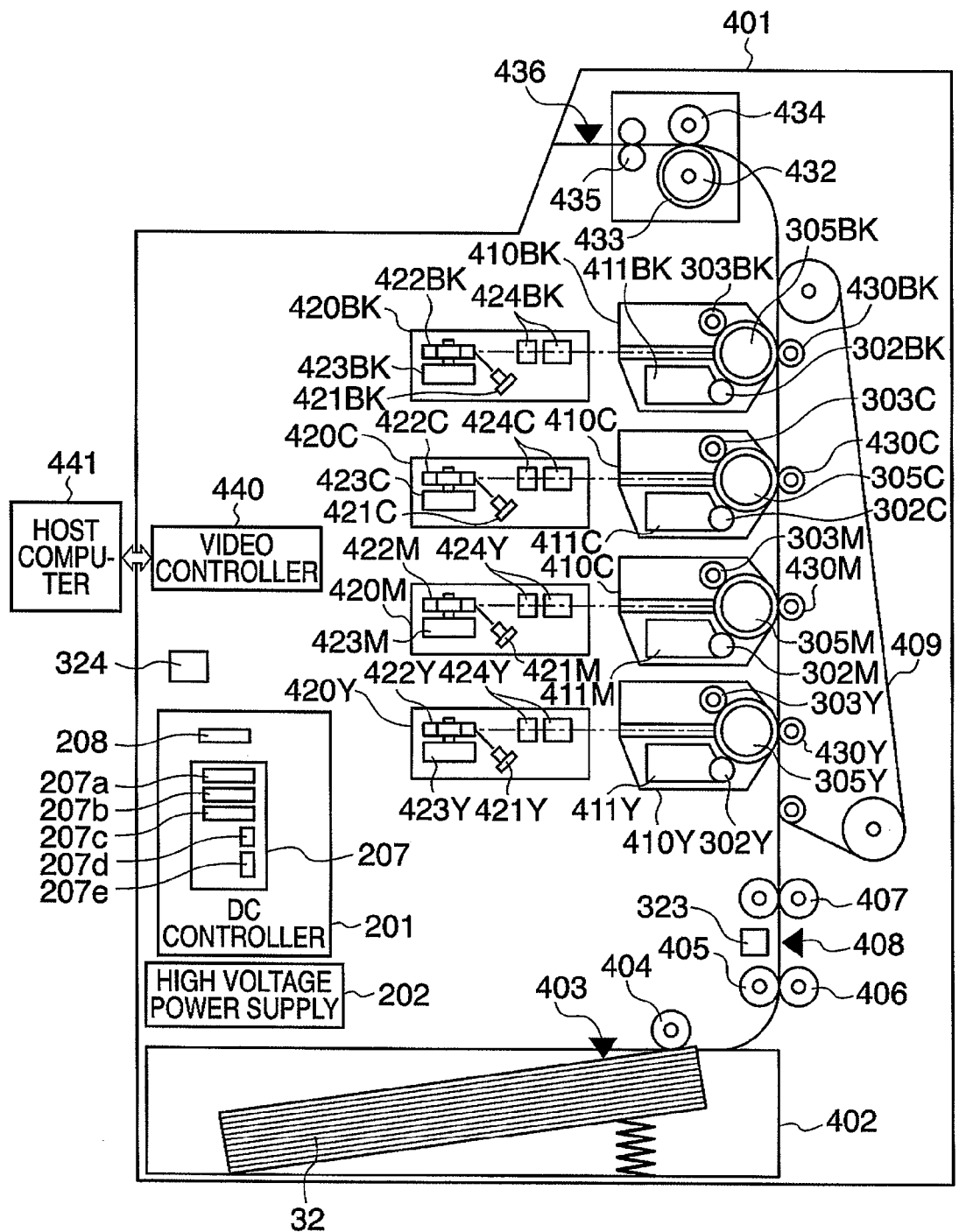
FIG. 2 is a configuration diagram of a color laser printer according to an embodiment of the present invention.

FIG. 2 is a configuration diagram of a color laser printer as one example of an image forming apparatus to which the piezoelectric transformer high-voltage power supply according to the present invention can be applied.

Reference numeral 401 denotes a color laser printer, reference numeral 402 denotes a deck that stores recording sheets 32, reference numeral 403 denotes a deck sheet presence/absence sensor that detects the presence or absence of recording sheets 32 inside the deck 402, reference numeral 404 denotes a pickup roller that draws up a recording sheet 32 from the deck 403. Further, reference numeral 405 denotes a deck sheet supply roller that conveys the recording sheet 32 that is drawn up by the pickup roller 404, and reference numeral 406 denotes a retard roller that forms a counterpart with the deck sheet supply roller 405 for preventing double feeding of recording sheets 32. Downstream of the deck sheet supply roller 405 are disposed a pair of registration rollers 407 that simultaneously convey a recording sheet 32, and a pre-registration sensor 408 that detects a conveyance state of the recording sheet 32 towards the pair of registration rollers.

Downstream of the pair of registration rollers 407 is provided an electrostatic adsorptive conveyance transfer belt (hereunder, abbreviated as "ETB") 409. Further, image forming units for four colors (yellow: Y, magenta: M, cyan: C, and black: Bk) are provided that comprise process cartridges 410Y, 410M, 410C, and 410Bk and scanner units 420Y, 420M, 420C, and 420Bk. Images that are formed by the image forming units are overlaid in sequence on the ETB 409 by transfer rollers 430Y, 430M, 430C, and 430Bk to form a color image. The color image is transferred onto the recording sheet 32 and the recording sheet 32 is conveyed downstream. A pair of a pressure roller 434 and a fixing roller 433 that comprises a heater 432 for heating the inside thereof to thermally fix the toner images that are transferred onto the recording sheet 32 are provided downstream of the image forming units. A pair of fixing discharge rollers 435 for conveying the recording sheet 32 from the fixing roller and a fixing discharge sensor 436 that detects the conveyance state from the fixing unit are also provided.

Next, respective image forming units will be described. In the figure, the symbols Y (yellow), M (magenta), C (cyan), and Bk (black) for each are added at the end of the reference numerals for the process cartridges 410Y, 410M, 410C, and 410Bk and the scanner units 420Y, 420M, 420C, and 420Bk and the like. However, to simplify the expression, in the following description the symbols relating to these colors are omitted and these components are denoted simply by 410, 420 and the like.

Each scanner unit 420 includes a laser unit 421 that emits a laser beam that is modulated on the basis of image signals that are sent from a video controller 440. Each scanner unit 420 also includes a group of image forming lenses 424, a scanner motor 423 and a polygon mirror 422 for scanning a laser beam from each laser unit 421 onto respective photosensitive drums 305. Each process cartridge 410 comprises a photosensitive drum 305, a charging roller 303, and a developing roller 302 that are necessary for the electrophotographic process, and a toner storage container 411. Each process cartridge 410 is configured to be detachable from the laser printer 401 main unit. Upon receiving image data that is sent from an external device 441 such as a personal computer, the video controller 440 expands the image data into bit map data to generate an image signal for image formation.

Reference numeral 201 denotes a DC controller that performs overall control of the laser printer 401. The DC controller 201 comprises an MPU (microcomputer) 207 that includes a RAM 207a, a ROM 207b, a timer 207c, a digital input/output port 207d and a D/A port 207e, and a nonvolatile memory device (EEPROM) 208. The DC controller 201 also comprises various input/output control circuits that are not shown in the figure. Reference numeral 202 denotes a high voltage power supply (piezoelectric transformer-type high-voltage power supply device). The high voltage power supply 202 includes a charging high-voltage power supply unit (not shown) and a developing high-voltage power supply unit that correspond to each process cartridge 410, and a transfer high-voltage power supply unit that uses a piezoelectric transformer that is capable of outputting a high voltage and corresponds to each transfer roller 430.

<Configuration of Piezoelectric Transformer High-Voltage Power Supply>

Figure 1:
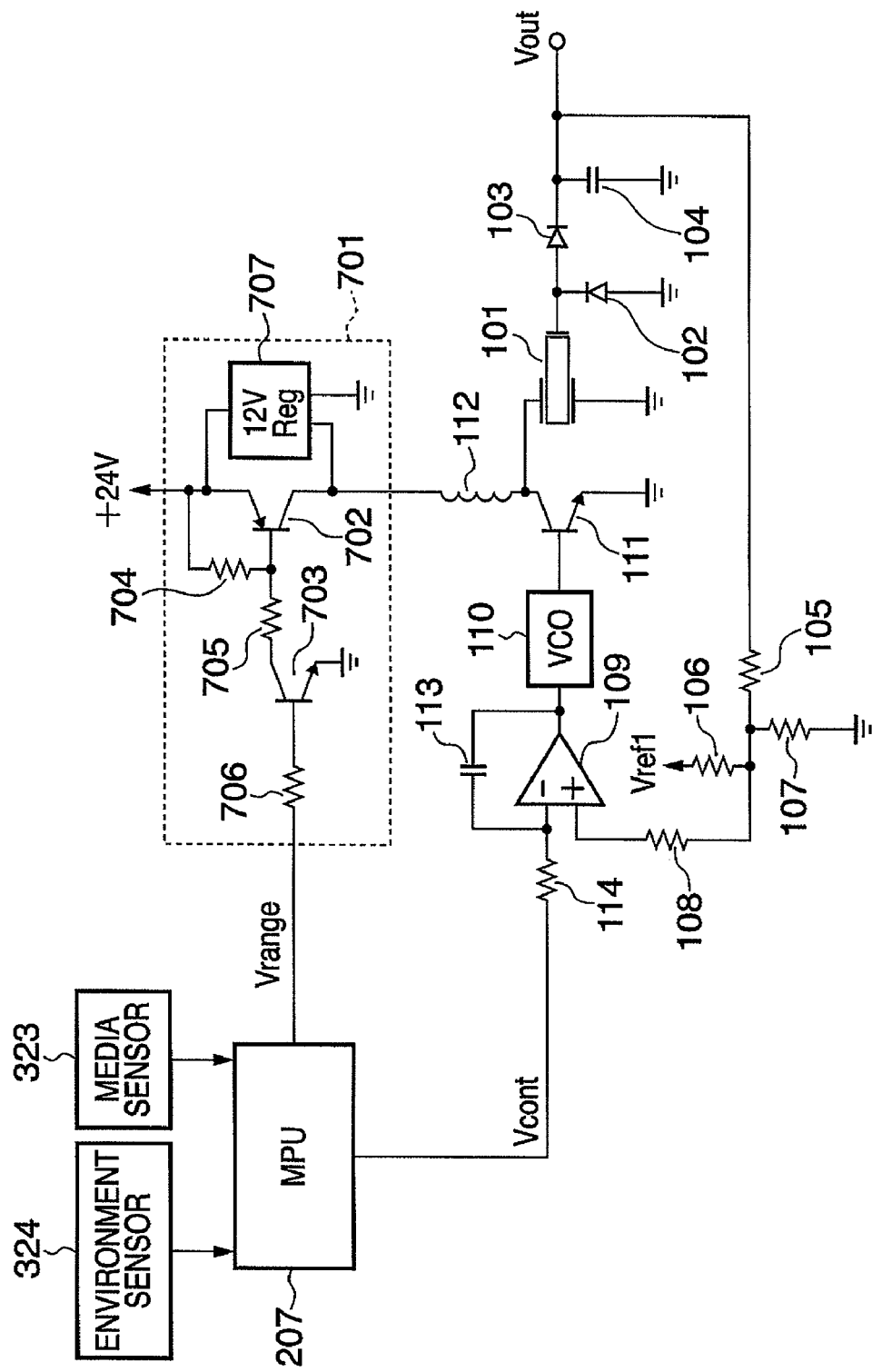
FIG. 1 is a circuit diagram of a piezoelectric transformer-type high-voltage power supply according to a first embodiment of the present invention.

Next, the configuration of the piezoelectric transformer-type high-voltage power supply according to the present embodiment will be described using FIG. 1 and FIG. 3. The piezoelectric transformer-type high-voltage power supply described hereunder, is described as a high voltage power supply for outputting a high voltage with respect, for instance, to a transfer roller. That is, with the piezoelectric transformer high-voltage power supply of the present embodiment, it is possible to appropriately select an output object other than a transfer roller, as long as it is a high-voltage output object in an image forming apparatus. FIG. 1 is a circuit diagram of a piezoelectric transformer high-voltage power supply according to the present embodiment. Parts that are the same as in the configuration of the background technology shown in FIG. 10 are denoted by the same reference numerals, and a description of those parts is omitted. The difference with the circuit diagram of the background technology is that the driving voltage characteristics of the piezoelectric transformer can be switched by a control circuit 701. Hereunder, the operation of the control circuit 701 is described.

Because the transistors 703 and 702 turn "off" when a signal Vrange from the MPU 207 serving as a decision unit is "low", a three-terminal regulator (output 12 V) 707 operates to regulate 24 V to 12 V. Therefore, in this case the piezoelectric transformer is driven with a lower voltage than a case in which 24 V is directly coupled to the inductor 112.

In contrast, because the transistors 703 and 702 turn "on" when a signal Vrange from the MPU 207 is "high", a voltage of approximately 24 V (voltage obtained by subtracting the VCE of the transistor 702 from 24 V) is supplied to the inductor 112. The three-terminal regulator (output 12 V) 707 does not function in this case. Switching between "high" and "low" for the Vrange signal is conducted based on signals from an environment sensor 324 (FIG. 2) or a media sensor 323 (FIG. 2).

Figure 3:
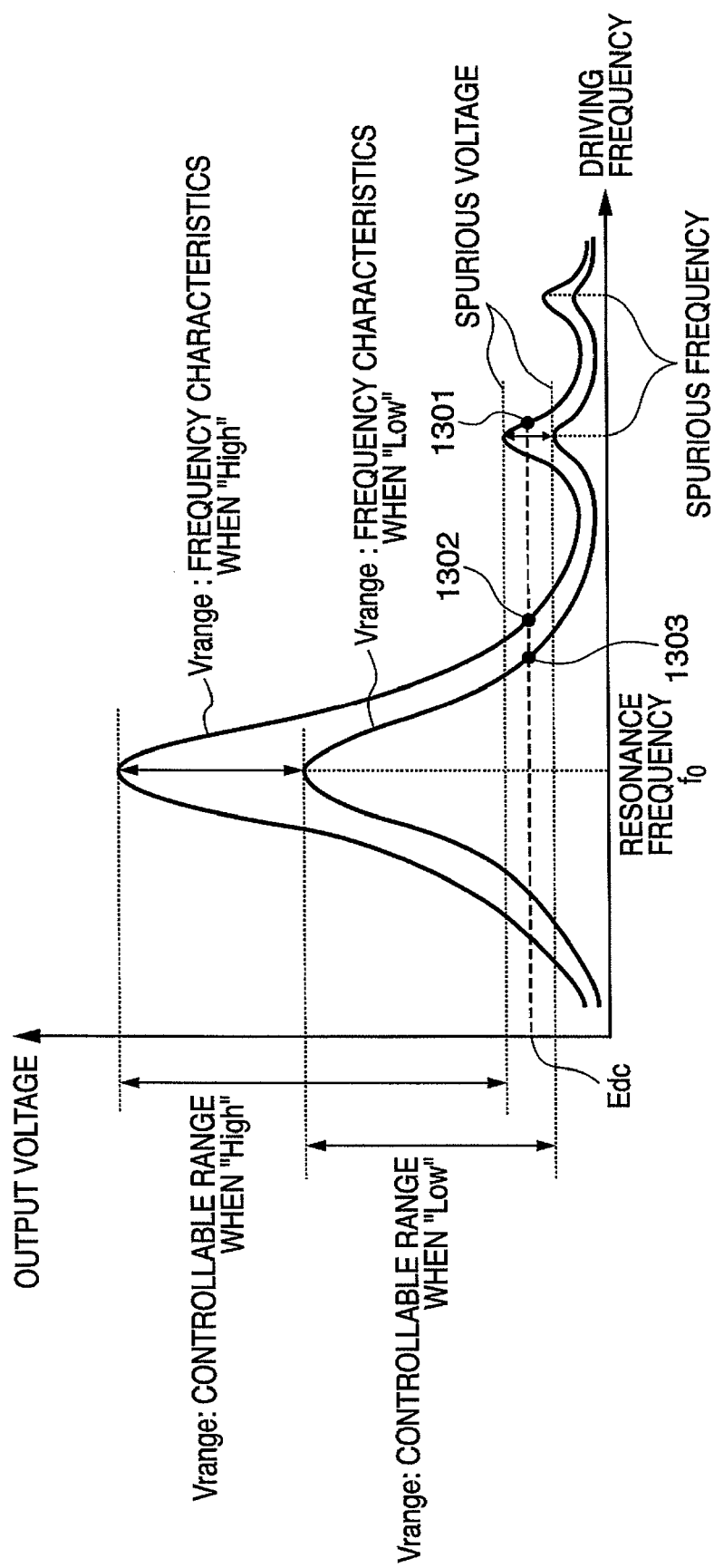
FIG. 3 is a view that represents the characteristics of the driving frequency and the output voltage of a piezoelectric transformer according to an embodiment of the present invention.
Figure 9:
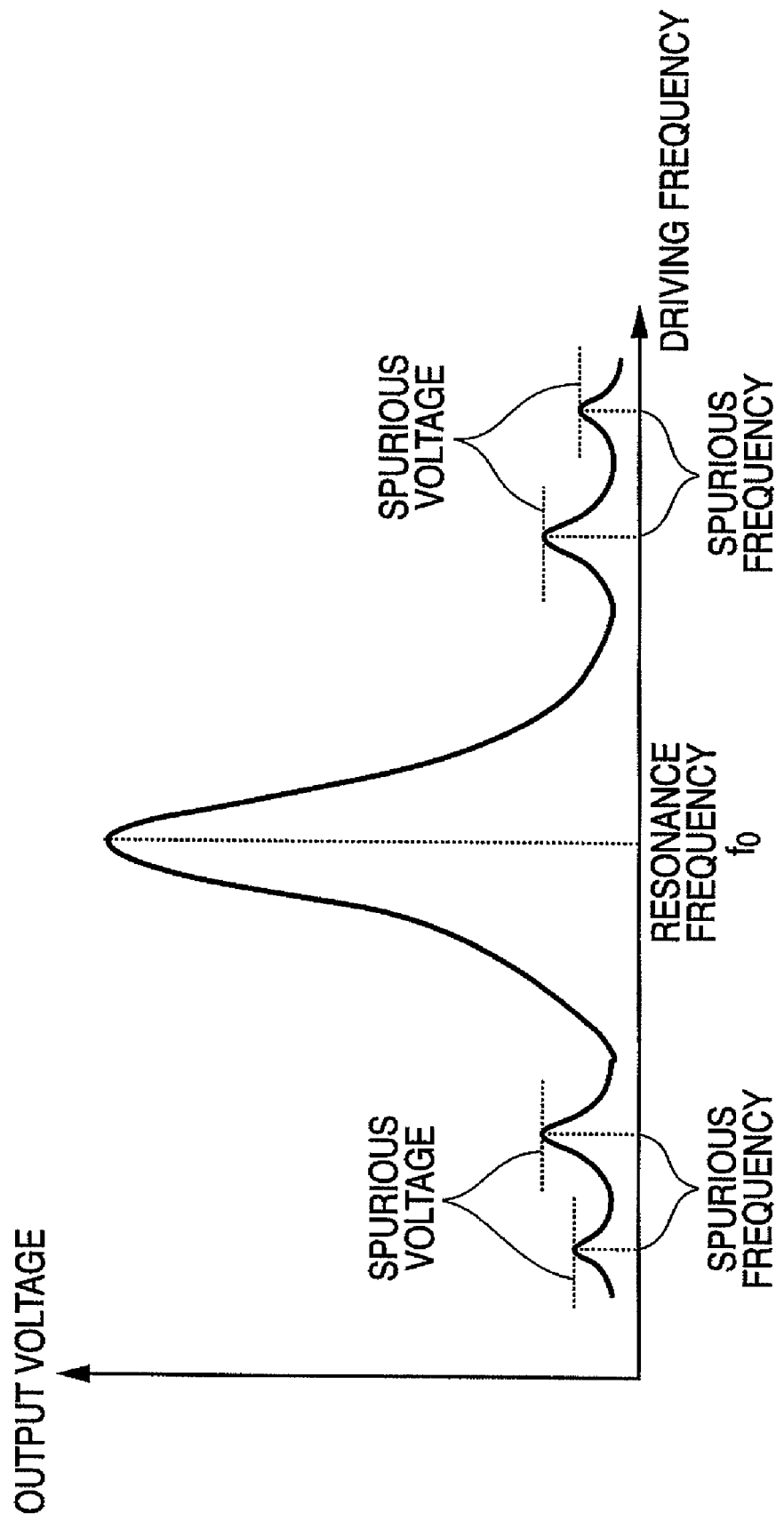
FIG. 9 is a view that represents the characteristics of the driving frequency and the output voltage of a piezoelectric transformer.

FIG. 3 is a graph representing frequency characteristics of the piezoelectric transformer and control of Vrange. In this case the ordinate represents output voltage and the abscissa represents driving frequency. Since a case is described here of performing control for a side with a higher frequency than the resonance frequency f0, only the spurious frequency on the high frequency side is shown. However, since a spurious frequency also exists on a low frequency side as shown in FIG. 9, a case of performing control for a side with a lower frequency than the resonance frequency f0 may be considered in the same way.

Here, the adverse effects of performing control to output a comparatively low voltage Edc when the signal Vrange from the MPU 207 is "high" will be described.

Normally, a driving frequency that is generated by the VCO 110 serving as a frequency generation unit is set in a broad manner so that a resonance frequency f0 does not fall outside an operating range due to individual variations among piezoelectric transformers, and thus includes a spurious frequency. When performing control on the side of a higher frequency than the resonance frequency f0 as shown in FIG. 3, since the control starts from the high frequency side, when an output voltage Edc is required, control is established at a point 1301. However, at this time, if a load such as a transfer roller that is the object of the high-voltage output increases momentarily, the frequency characteristics curve in a case in which Vrange is "high" momentarily falls to a low voltage. When the frequency characteristics curve falls to a low voltage, the circuit shown in FIG. 1 operates to maintain the output voltage at Edc (the operational amplifier 109 functions and operates to maintain the output voltage). At that time, the control point moves from 1301 to 1303 since the spurious voltage becomes lower than Edc. In other words, the driving frequency must be changed significantly. More specifically, the frequency value must be decreased to a large degree. As a result, a defect such as an unsatisfactory image occurs accompanying the large voltage fluctuation in the process of changing that driving frequency.

Since the above described adverse effects only occur when the output voltage is low, in an environment in which an output voltage target value is low, if the MPU 207 previously sets the signal Vrange to "low", the effects of the spurious frequency can be suppressed. That is, by setting Vrange to "low", the spurious voltage is lowered and control with respect to the voltage Edc is performed at point 1303 from the start. Therefore, control can also be performed with respect to instantaneous load fluctuations without being accompanied by large voltage fluctuations.

The MPU 207 serving as a decision unit decides whether or not the target value for output voltage is a low environment on the basis of output from various sensors such as the environment sensor 324 and the media sensor 323. If the target value for output voltage is a low environment, the MPU 207 sets Vrange to "low". As a result, even at the time of a low voltage output, large voltage fluctuations are not liable to occur with respect to load fluctuations. That is, power that is resistant to load fluctuations can be supplied. In an environment in which an output voltage target value is high, a wide voltage range can be realized by setting Vrange to "high". For example, since control is performed at a low voltage in a high temperature and high humid environment in which the load of a transfer roller decreases, it is sufficient to set Vrange to "low". In a normal environment or a low temperature and low humidity environment, it is sufficient to switch Vrange to "high" in order to output a high voltage.

According to the present embodiment, upon receiving a signal from the MPU 207, the circuit 701 functions as a control unit that changes the driving frequency characteristics of the power supply device in accordance with a target value for output voltage to control a spurious voltage. That is, the circuit 701 controls the output voltage so as to produce driving frequency characteristics having different spurious voltage in accordance with whether the target value for output voltage is a high voltage or a low voltage. It is thereby possible to output a voltage of a wider range with a single piezoelectric transformer.

The MPU 207 may also decide whether or not the environment is one in which instantaneous load fluctuations are liable to occur based on the output of various sensors. If the environment is one in which instantaneous load fluctuations are not liable to occur even if the environment is one in which the output voltage target value is low, the signal Vrange from the MPU 207 may be set to "high".

Second Embodiment

Figure 4:
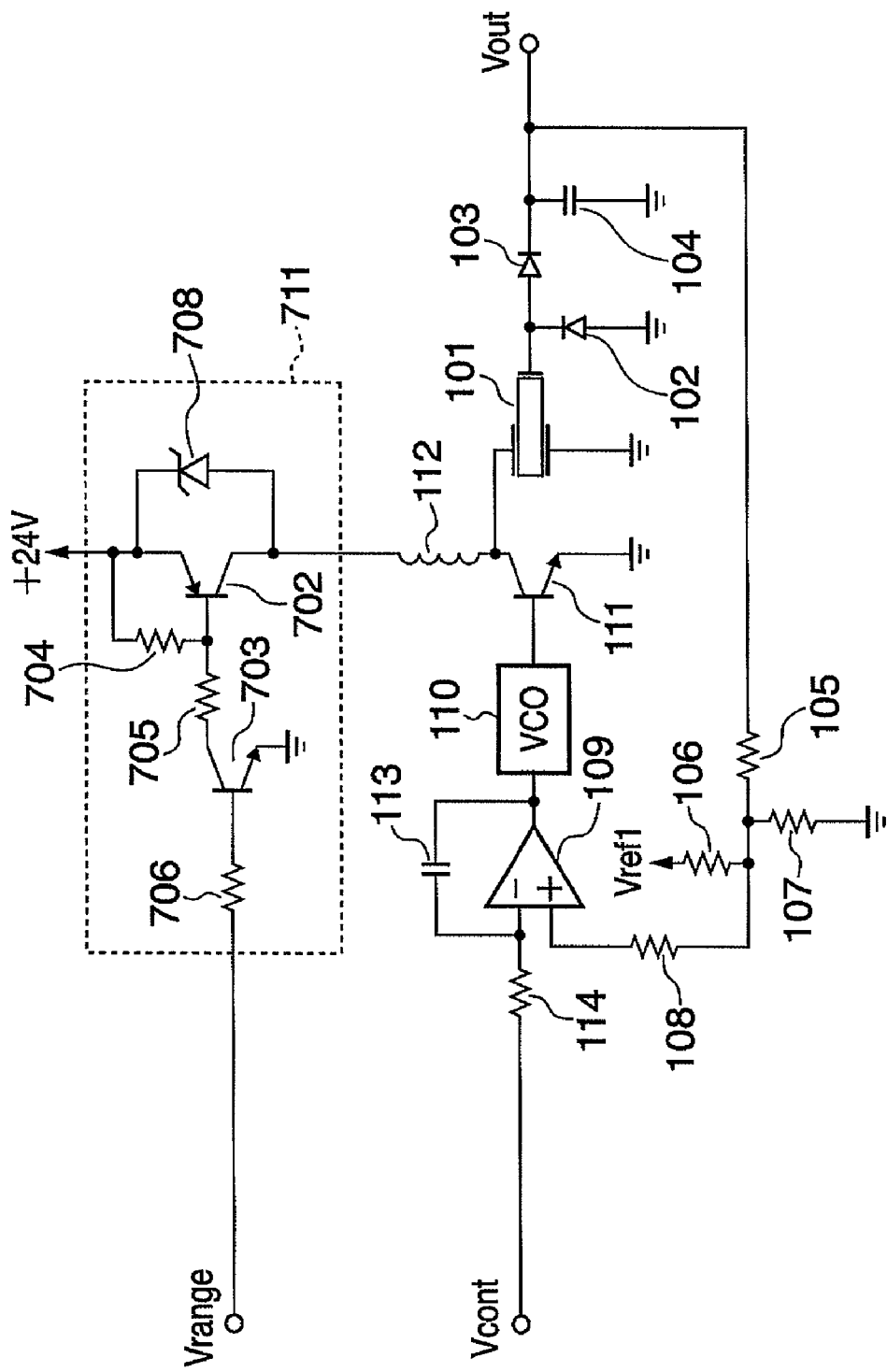
FIG. 4 is a circuit diagram of a piezoelectric transformer-type high-voltage power supply according to a second embodiment of the present invention.

FIG. 4 is a view that illustrates the second embodiment. Unlike the first embodiment, a Zener diode is used as means for controlling a spurious voltage. The remaining configuration and operations are the same as in the first embodiment, and a description of these is thus omitted below.

Since the transistors 703 and 702 turn "off" when the Vrange signal is "low", 24 V is applied to the Zener diode 708 of 12 V and the voltage that dropped to 12 V is applied to the inductor 112. As a result, the piezoelectric transformer driving frequency characteristics shown in FIG. 4 are obtained in the same manner as in the first embodiment, and by making it difficult to receive the influence of a spurious frequency it is possible to perform control at a low voltage. Thus, in comparison to the first embodiment, the output voltage range can be broadened with a lower cost configuration.

Third Embodiment

Figure 5:
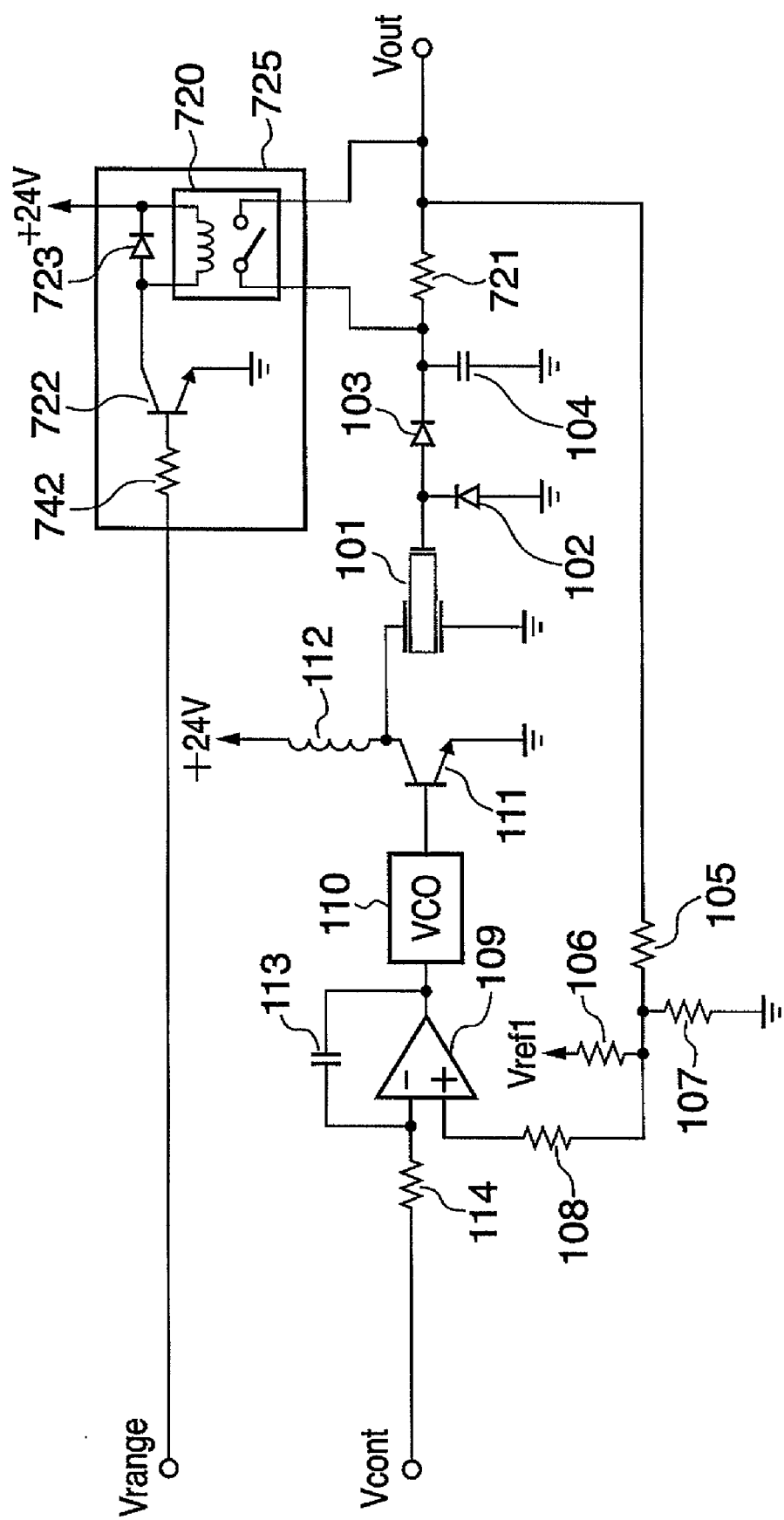
FIG. 5 is a circuit diagram of a piezoelectric transformer-type high-voltage power supply according to a third embodiment of the present invention.

FIG. 5 is a view that illustrates the third embodiment. The principle difference from the first embodiment is that a switching circuit 725 that switches between the presence/absence of a resistance is provided in the output end side of the piezoelectric transformer 101 to control a spurious voltage. The remaining configuration and operations are the same as in the first embodiment, and a description of these is thus omitted.

When the Vrange signal is "high", the transistor 722 turns "on" and a high voltage relay 720 enters a conducting state. The output voltage of the piezoelectric transformer 101 that is rectified by the diodes 102 and 103 and the capacitor 104 is output in that state as an output voltage Vout, and a current does not flow to a limiting resistance 721.

In contrast, when the Vrange signal is "low", the transistor 722 turns "off" and the high voltage relay 720 enters a non-conducting state. Since a voltage applied to a load (not shown) from the output Vout at this time is divided between the limiting resistance 721 and a resistance component of the load (not shown), that voltage becomes smaller than the voltage that is actually being supplied by the piezoelectric transformer 101. In other words, although the voltage-frequency characteristics with respect to the output of the piezoelectric transformer 101 are the characteristics when Vrange is "high" as shown in FIG. 3, the voltage-frequency characteristics that are applied to the load (not shown) exhibits the characteristics of a time when Vrange is "low". By performing control with the output Vout voltage, control can be performed with the frequency characteristics curve when the Vrange shown in FIG. 3 is "low", enabling control to be performed at a low voltage. By switching with the high voltage relay 720, the presence/absence of the influence of the resistance 721 is changed and as a result the output voltage is controlled.

As described above, a spurious voltage is controlled by switching a resistance value on the output end side, making it possible to obtain a broad control range for a single piezoelectric transformer.

Fourth Embodiment

Figure 6:
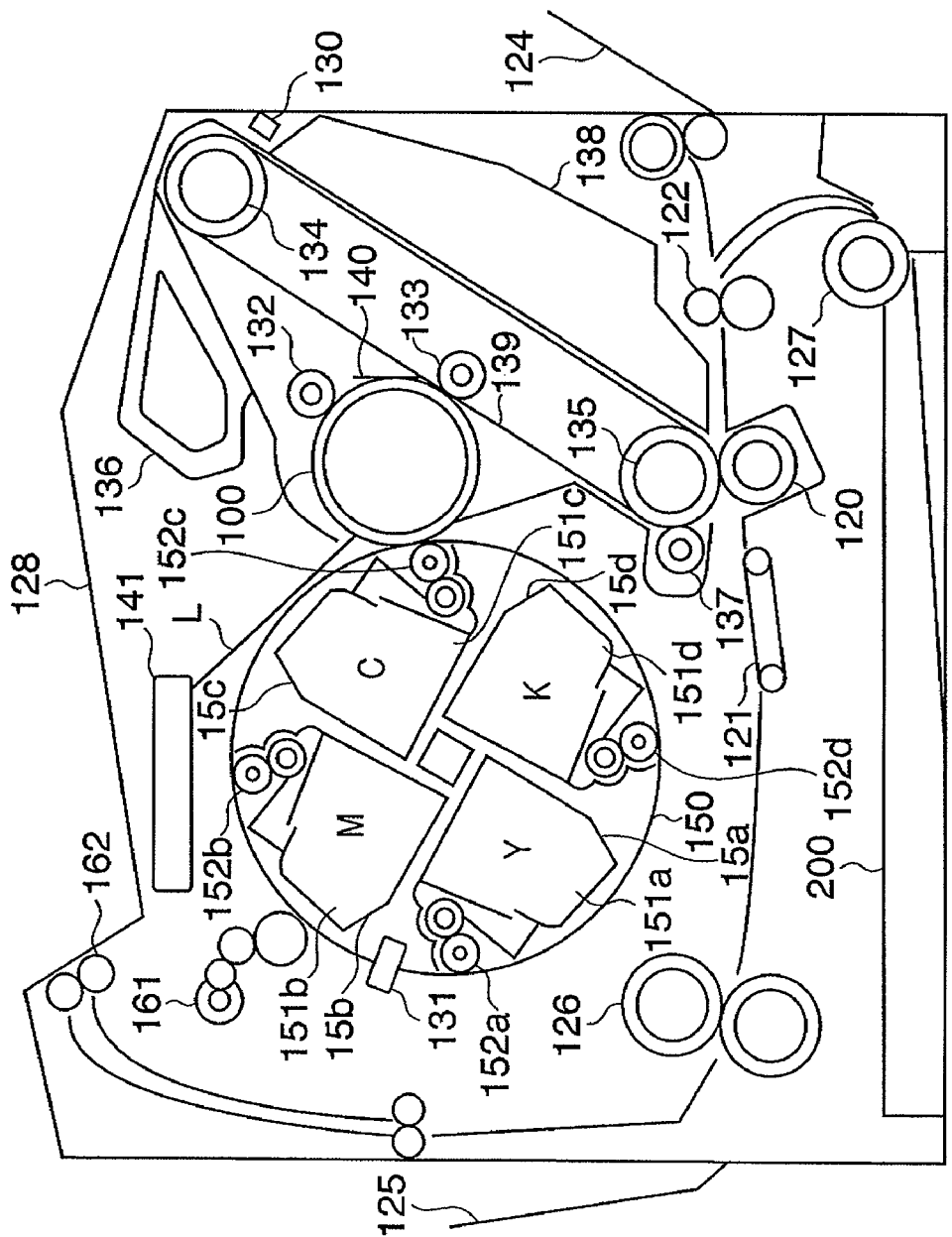
FIG. 6 is a configuration diagram of a color laser printer that is favorable for a fourth embodiment of the present invention.
Figure 7:
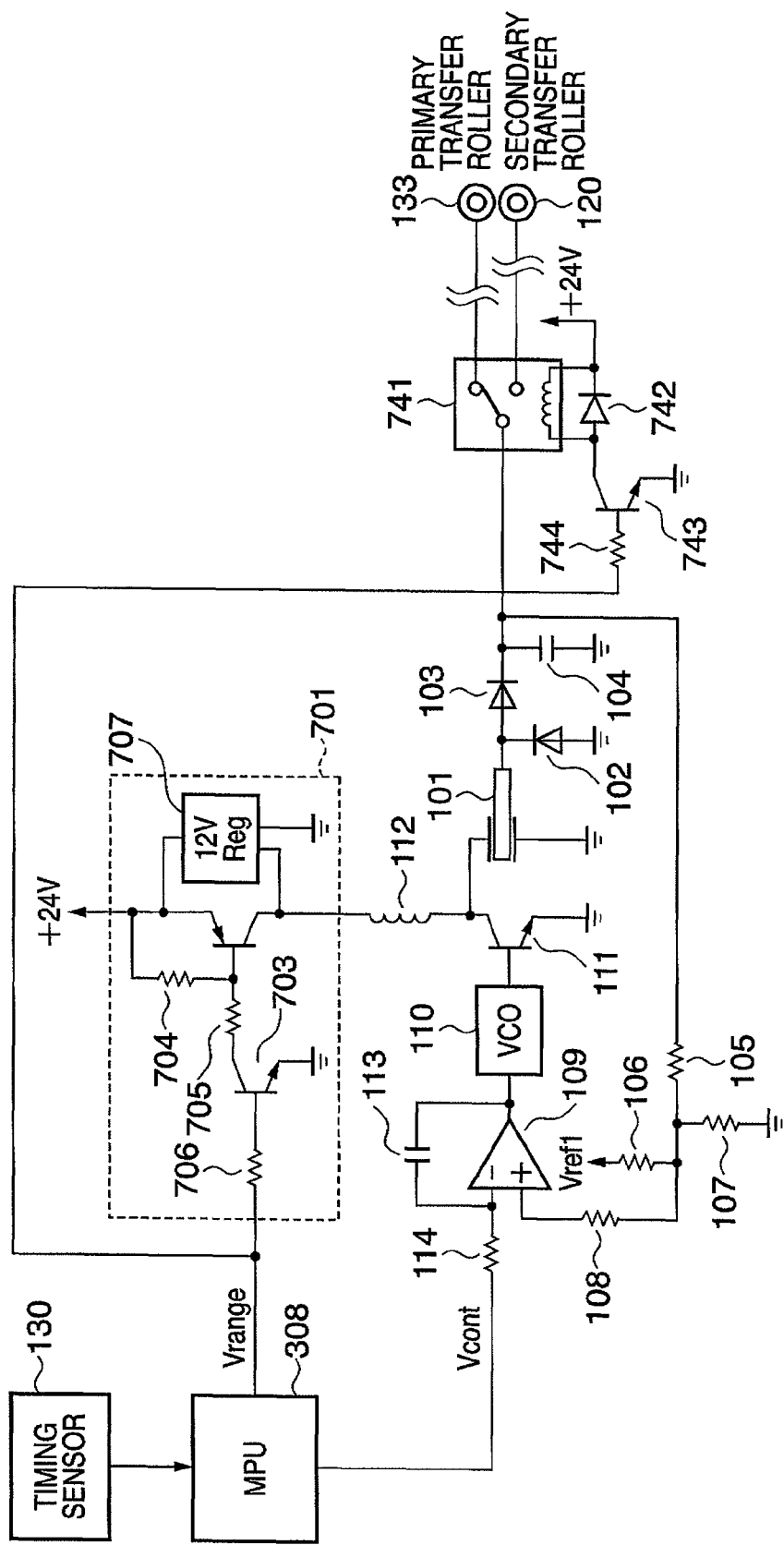
FIG. 7 is a circuit diagram of a piezoelectric transformer-type high-voltage power supply according to the fourth embodiment of the present invention.

FIG. 6 is a view that illustrates the overall configuration of an image forming apparatus according to the fourth embodiment. FIG. 7 is a view that illustrates the configuration of a piezoelectric transformer-type high-voltage power supply according to the fourth embodiment. The difference between the present embodiment and the first to third embodiments is that a configuration that switches the voltage driving characteristics of the piezoelectric transformer is applied to two output objects.

The following two systems are well known as configurations of a color image forming apparatus (color laser printer). The first system (hereunder, referred to as a "tandem system") comprises image forming units (also called "image forming stations") that include photosensitive members, charging devices, and developing apparatuses and the like of the same number as the number of colors necessary for image formation as is described according to the first embodiment. The second system (hereunder, referred to as a "rotary system") comprises a single photosensitive member, and forms a color image by repeating image formation thereon the same number of times as the number of colors of developer. The tandem system is suited to high-speed color image formation, while the rotary system is suited to a small size, low cost apparatus.

A feature of the present embodiment is that the configuration is one in which a high voltage is output to two objects (loads) from a single piezoelectric transformer-type high-voltage power supply. A premise for achieving this is that the timings for outputting the high voltages are different. It is considered that the more suitable apparatus for this configuration is an image forming apparatus according to the aforementioned rotary system. Hence, first the overall configuration of an image forming apparatus according to the rotary system will be described using FIG. 6. The apparatus according to the rotary system has a single photosensitive drum 100, an optical unit 141 for exposing the photosensitive drum, and a charging roller 132 for charging the photosensitive drum. The apparatus has four developing units (developing devices) 151a, 151b, 151c, and 151d, a rotary developing device retaining member 150 for retaining the developing units, and a rotary developing device retaining member driving unit (hereunder, referred to as a "motor") 161. Further, the apparatus has a primary transfer roller 133 for transferring an image from the photosensitive drum 100 onto an intermediate transfer member, and an intermediate transfer member tension roller 134 and an intermediate transfer member drive roller for driving the intermediate transfer member. The apparatus also has an intermediate transfer member cleaning roller 137 for cleaning the intermediate transfer member. Furthermore, the apparatus has a rotary developing device reference position detection sensor 131 (hereunder, referred to as "home position sensor") that is a detecting unit of the reference position on the rotary developing device retaining member. The apparatus also has a secondary transfer roller for transferring an image on the intermediate transfer member onto a transferring material. In addition, the apparatus has a conveying belt 121, a fixing unit 126, a sheet supply tray 200, a manual feed tray 124, and a sensor 130 for detecting an image density. The sensor 130 is also used as a sensor for detecting a timing at which images formed by the four developing units undergo primary transfer onto the photosensitive drum and a timing at which conveying of a transferring material starts. The apparatus further has a discharge roller 162, a discharge tray 125, and an upper discharge tray 128 and the like.

A general outline of image formation with respect to a transferring material will now be described. First, the surface of the photosensitive drum 100 is uniformly charged to a desired polarity by the charging roller 132 disposed on the photosensitive drum 100. Next, based on image data that is sent from a controller on the basis of an image synchronizing signal, a latent image is formed on the photosensitive drum 100 by exposing the top of the photosensitive drum with a laser L using the optical unit 141. An example of a process for visualizing the latent image is as follows. For example, a latent image that is on the photosensitive drum 100 in the form of the developing unit for Y (yellow) 151a, that is a latent image formed on the photosensitive drum 100 by applying a predetermined voltage to a developing roller 152, is developed with toner as developer that is inside a developer container 15a. A visualized toner image is thus formed on the photosensitive drum 100.

Thereafter, the toner image on the photosensitive drum 100 is subjected to primary transfer onto an intermediate transfer member 139 by the primary transfer roller 133 to temporarily retain the image.

Similarly, toner images are formed for M (magenta), C (cyan), and Bk (black) on the photosensitive drum 100 with developing units 151b, 151c, and 151d for each color by sequentially performing development of latent images in accordance with respective image data using toner in developer containers 15b, 15c, and 15d and developing rollers 152b, 152c, and 152d of the respective developing units. The toner images for each color are then transferred in sequence onto the intermediate transfer member 139 to retain the images.

Since the retained toner images of each color on the intermediate transfer member 139 are subjected to transferring at a predetermined timing, a multiple toner image is formed on the intermediate transfer member 139. Meanwhile, after development with the final image forming color is completed, the secondary transfer roller 120 and the intermediate transfer member cleaning roller 137 are caused to contact against an intermediate transfer member drive roller 135 through the intermediate transfer member 139 at a predetermined timing. After contacting with the intermediate transfer member 139, a high voltage is applied to each roller (for example, a transfer high voltage of opposite polarity (for example, positive polarity) to the toner image is applied to the secondary transfer roller 120 at a predetermined timing, and a voltage of a positive polarity is applied in the same manner to the cleaning roller 137) and, for example, a voltage of the same polarity and the same potential as the primary transfer roller 133 is applied to the intermediate transfer member drive roller 135, and the intermediate transfer member 139 waits for the transferring material to be conveyed.

Separately, at a necessary predetermined timing for transferring the toner image, a transferring material is fed by a sheet feeding roller 127 from the sheet supply tray 200 or by a sheet feeding roller 123 from the manual feed tray 124. The fed transferring material stops temporarily at a registration roller 122, and waits for completion of image formation of the final color onto the intermediate transfer member 139.

After image formation of the final color (Bk) is completed, the registration roller 122 starts conveying the transferring material again at a desired timing. The conveyed transferring material is conveyed between the intermediate transfer member 139 that is being driven by the intermediate transfer member drive roller 135 and the secondary transfer roller 120 that is brought in contact therewith, and the multiple toner image of multiple colors on the intermediate transfer member 139 is transferred onto the transferring material by a potential difference in the bias applied to the intermediate transfer member drive roller 135 and the secondary transfer roller 120. Thereafter, toner that remains on the intermediate transfer member 139 after the transfer is removed by the cleaning roller 137. Alternatively, re-charging is performed and therefore the residual toner on the intermediate transfer member 139 is returned to the photosensitive drum 100 and is recovered by a cleaning blade 140 that contacts the photosensitive drum 100. The residual toner that is recovered by the cleaning blade 140 is accumulated in a waste toner area 138 by an unshown driving system. Further, residual toner that adheres to the cleaning roller 137 is recovered to the photosensitive drum 100 after a separate predetermined process.

After transfer of the image to the transferring material is completed, the cleaning roller 137 and the secondary transfer roller 120 are separated from the intermediate transfer member drive roller 135 to prepare for the next image formation.

In this connection, the surface of the photosensitive drum 100 that has been cleaned is again uniformly charged to a desired polarity by the charging roller 132 in preparation for the next latent image formation and development process. The same applies to the intermediate transfer member 139 from which residual toner has been cleaned.

Meanwhile, the transferring material onto which the toner image is transferred is conveyed by the conveying belt 121, and the toner image is fixed to the transferring material at the fixing unit 126. The transferring material onto which the toner image is fixed is discharged onto the upper discharge tray 128 or the lower discharge tray 125.

The sensor 130 is a device for performing density control for a toner image of each color at warm-up when the power of the image forming apparatus is turned on or at a predetermined timing. More specifically, the sensor 130 detects the density of a test image that is formed on the intermediate transfer member and controls the developing conditions and the like so that the toner density is appropriate. The term "predetermined timing" refers to, for example, timing that occurs each time image forming is performed for a predefined number of sheets. Further, detection of primary transfer timing or timing of the start of conveyance of a transferring material is used as means that detects a reference when reading an unshown reference position on the intermediate transfer member by a reflection or transmission method and performing image formation (primary transfer, secondary transfer). In this case the term "reference position" refers to, for example, previously providing a mark with a different reflection ratio to the belt, and taking that mark as a reference position. Although according to the present embodiment density detection and timing detection are performed with a single sensor 130, separate units may be used for these detections.

Next, the configuration of the piezoelectric transformer-type high-voltage power supply according to the present embodiment will be described using FIG. 6 and FIG. 7. In this case, an example is described in which a high voltage is applied to the primary transfer roller and the secondary transfer roller as the output objects for a high voltage. For the high voltage that is applied to the primary transfer roller (hereunder, referred to as "primary transfer bias"), the output voltage target value is low (approximately 100 V to 1000 V). Further, for the high voltage that is applied to the secondary transfer roller (hereunder, referred to as "secondary transfer bias"), the output voltage target value is high (approximately 1000 V to 4000 V).

In the process of image formation, during a period until images of the four colors Y, M, C, and Bk are formed on the intermediate transfer member 139, it is necessary to apply a high voltage to the primary transfer roller 133, and the output of the high voltage power supply is thus connected to the primary transfer roller 133. A decision regarding connection of the high voltage output to the primary transfer roller is made by the sensor 130 based on a timing signal of primary transfer of each of the four colors by the developing units. When a timing signal is sent to an MPU 308 (not shown in FIG. 6), a Vrange signal is sent from the MPU 308 to the high voltage power supply to thereby connect the high voltage power supply to the primary transfer roller. The Vrange signal at this time is fixed at "low", and the high voltage power supply makes the primary transfer roller 133 the connection destination of a relay 741 until primary transfer of images of four colors to the intermediate transfer member 139 is completed. Simultaneously thereto, a three-terminal regulator (output 12 V) 707 is activated. That is, when the Vrange signal is "low", the drive frequency characteristics of the high voltage power supply are changed to a low voltage side to output a primary transfer bias.

After an image of the final color (Bk) is formed on the intermediate transfer member 139, the MPU 308 switches the Vrange signal to "high" based on a signal from the sensor 130. This is in synchronization with a timing at which reconveying of the transferring material is temporarily stopped at the registration roller 122 starts. By making the Vrange signal to "high", the output of the high voltage power supply is switched to the secondary transfer roller 120 at the relay 741. At the same time, transistors 702 and 703 are turned "on" and the piezoelectric transformer 101 is driven with 24 V without causing the three-terminal regulator to function. That is, when the Vrange signal is "high", the drive frequency characteristics are changed to a high voltage side to output a secondary transfer bias.

Subsequently, the sensor 130 detects a timing at which the transfer of the images onto a transferring material is completed, and the Vrange signal from the MPU 308 is switched to "low" to connect the high voltage power supply to the primary transfer roller to prepare for the next image formation.

In the foregoing, a configuration in which a control range is switched with a single piezoelectric transformer power supply is applied to perform switching of output and switching of a control range with respect to a plurality of output objects, thus enabling the setting of an appropriate control range in accordance with an output object.

According to the present embodiment, a case was described in which an output and a control range are switched with respect to a primary transfer bias and a secondary transfer bias. However, the present configuration is not limited to only the above described control objects. The present configuration can be suitably applied as long as there are a plurality of output objects for which the output timing differs and the control range differs.

Further, although according to the present embodiment a control range is switched with respect to two output objects, as long as a case is one in which output timings do not overlap for three or more output objects, the present configuration can be applied using a switching element such as a high voltage relay.

Other Embodiments

According to the first to fourth embodiments configurations were described in which the output voltage is increased by changing the driving frequency of a piezoelectric transformer from a high-pass side to a low-pass side. However, the output voltage may also be increased by changing the driving frequency from a low-pass side to a high-pass side.

According to the first to fourth embodiments the configuration of a color laser printer was described as an image forming apparatus. However, the image forming apparatus is not limited to a color laser printer and may be a black and white laser printer, a copy machine, or a facsimile machine.

Although according to the first to fourth embodiments a description was made regarding four circuits for controlling a spurious voltage, the present invention is not limited thereto. Another configuration may be adopted as long as the circuit can control a spurious voltage in accordance with a target value of an output voltage.

According to the present invention, it is possible to output a voltage of a wider range with a single piezoelectric transformer. Further, it is possible to stabilize control by performing control without receiving the influence of a spurious frequency at the time of low voltage output.

Checked to here (dan)

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-336379, filed Dec. 13, 2006, and Japanese Patent Application No. 2007-300973, filed Nov. 20, 2007, which are hereby incorporated by reference herein in their entirety.

What is claimed is:

1. A power supply device that outputs a voltage using a piezoelectric transformer, comprising:
    a frequency generation unit configured to generate a driving frequency signal for driving the piezoelectric transformer;
    a control unit configured to control an output voltage of the piezoelectric transformer by controlling a driving frequency corresponding to the driving frequency signal; and
    a driving voltage switching unit configured to switch a driving voltage that is supplied to the piezoelectric transformer;
    wherein, when the output voltage is to be switched to a lower target voltage, the control unit instructs the driving voltage switching unit to switch the driving voltage to a lower driving voltage so that an output voltage corresponding to a spurious frequency for the piezoelectric transformer is lowered.

2. The power supply device according to claim 1, wherein the control unit, by switching the driving voltage, changes frequency characteristics that represent a relation between the driving frequency and the output voltage, and controls an output voltage of the piezoelectric transformer based on the frequency characteristics that are changed.

3. The power supply device according to claim 1, wherein the driving voltage switching unit includes a three-terminal regulator configured to switch a driving voltage of the piezoelectric transformer.

4. The power supply device according to claim 1, wherein the driving voltage switching unit includes a Zener diode configured to switch a driving voltage of the piezoelectric transformer.

5. The power supply device according to claim 1, wherein the driving voltage switching unit includes a switching circuit configured to switch between a presence/absence of a resistance at an output end of the piezoelectric transformer.

6. The power supply device according to claim 1, further comprising:
    a switching unit configured to switch an output object of the piezoelectric transformer;
    wherein the control unit instructs the switching unit to switch the output object.

7. The power supply device according to claim 1, wherein when a setting value of the output voltage is lower than a preset value, the control unit outputs a signal to the driving voltage switching unit to switch the driving voltage.

8. An image forming apparatus comprising an image forming unit configured to form an image on a transferring material, comprising:

a power supply unit having a piezoelectric transformer, a frequency generation unit configured to generate a driving frequency signal for driving the piezoelectric transformer, and a driving voltage switching unit configured to switch a driving voltage that is supplied to the piezoelectric transformer; and a control unit configured to control an output voltage that is output to the image forming unit from the piezoelectric transformer by controlling a driving frequency corresponding to the driving frequency signal;

wherein when the output voltage is to be switched to lower target voltage, the control unit instructs the driving voltage witching unit to switch the driving voltage to a lower driving voltage so that an output voltage corresponding to a spurious frequency for the piezoelectric transformer is lowered.

9. The image forming apparatus according to claim 8, wherein the image forming unit comprises an image bearing member, and a transfer member configured to transfer an image that is formed on the image bearing member onto a transferring material;

and wherein the control unit, in accordance with operating conditions of the transfer member, instructs the driving voltage switching unit to switch the driving voltage.

10. The image forming apparatus according to claim 9, wherein the operating conditions of the transfer member are set in accordance with an environment in which the image forming apparatus is placed or in accordance with a kind of the transferring material.

11. The image forming apparatus according to claim 8, wherein:

the image forming unit has an image bearing member, an intermediate transfer member, a primary transfer member configured to perform a primary transfer of an image that is formed on the image bearing member onto the intermediate transfer member, and a secondary transfer member configured to perform a secondary transfer of an image that is transferred onto the intermediate transfer member onto a transferring material;

the power supply unit further comprises a switching unit configured to switch an output object of the piezoelectric transformer; and the control unit instructs the switching unit to perform switching so as to switch an output of the piezoelectric transformer to either the primary transfer member or the secondary transfer member.

12. A power supply device that outputs a voltage using a piezoelectric transformer, comprising:

a frequency generation unit configured to generate a driving frequency signal for driving the piezoelectric transformer;

a control unit configured to control an output voltage of the piezoelectric transformer by controlling a driving frequency of the frequency generation unit; and a driving voltage switching unit configured to switch a driving voltage that is supplied to the piezoelectric transformer, wherein the control unit instructs the driving voltage switching unit to switch the driving voltage in accordance with a setting value of the output voltage, and wherein the driving voltage switching unit includes a three-terminal regulator configured to switch a driving voltage of the piezoelectric transformer.

13. An image forming apparatus comprising an image forming unit configured to form an image on a transferring material, comprising:

a power supply unit having a piezoelectric transformer, a frequency generation unit configured to generate a driving frequency for driving the piezoelectric transformer, and a driving voltage switching unit configured to switch a driving voltage that is supplied to the piezoelectric transformer; and a control unit configured to control an output voltage that is output to the image forming unit from the piezoelectric transformer by controlling a driving frequency of the frequency generation unit;

wherein the control unit instructs the driving voltage switching unit to switch the driving voltage in accordance with a setting value of the output voltage, wherein the image forming unit comprises an image bearing member, and a transfer member configured to transfer an image that is formed on the image bearing member onto a transferring material, and wherein the control unit, in accordance with operating conditions of the transfer member, instructs the driving voltage switching unit to switch the driving voltage.

* * * * *